(12) United States Patent
Han

(10) Patent No.: US 9,713,818 B2
(45) Date of Patent: Jul. 25, 2017

(54) DEPOSITION APPARATUS AND DEPOSITION METHOD USING THE SAME

(71) Applicant: Samsung Display Co., Ltd., Yongin, Gyeonggi-Do (KR)

(72) Inventor: Jeongwon Han, Yongin (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 140 days.

(21) Appl. No.: 14/664,672

(22) Filed: Mar. 20, 2015

(65) Prior Publication Data

US 2016/0105971 A1   Apr. 14, 2016

(30) Foreign Application Priority Data

Oct. 8, 2014   (KR) ................. 10-2014-0135961

(51) Int. Cl.
| | |
|---|---|
| *H05K 3/14* | (2006.01) |
| *B05B 13/02* | (2006.01) |
| *B05B 5/08* | (2006.01) |
| *B05B 15/04* | (2006.01) |
| *B05B 15/12* | (2006.01) |

(52) U.S. Cl.
CPC ............. *B05B 13/02* (2013.01); *B05B 5/082* (2013.01); *B05B 5/087* (2013.01); *B05B 13/0285* (2013.01); *B05B 15/045* (2013.01); *B05B 15/1222* (2013.01)

(58) Field of Classification Search
None
See application file for complete search history.

(56) References Cited

U.S. PATENT DOCUMENTS

2010/0156054 A1* 6/2010 Sun .................. C09D 183/04
                                                          279/128
2010/0188794 A1* 7/2010 Park ................... H01L 21/6831
                                                          361/234

FOREIGN PATENT DOCUMENTS

| KR | 10-2006-0058459 A | | 5/2006 |
| KR | 1020060058459 | * | 5/2006 |
| KR | 10-2009-0015378 A | | 2/2009 |
| KR | 10-2012-0140079 A | | 12/2012 |
| KR | 10-2013-0088369 A | | 8/2013 |
| KR | 10-1310336 B1 | | 9/2013 |
| KR | 10-2014-0038592 A | | 3/2014 |

* cited by examiner

*Primary Examiner* — Nathan T Leong
(74) *Attorney, Agent, or Firm* — Knobbe Martens Olson & Bear LLP

(57) ABSTRACT

A deposition apparatus and a deposition method are disclosed. In one aspect, the deposition apparatus includes an electrostatic chuck and a tensile plate attached to and formed over the electrostatic chuck. The deposition apparatus further includes an elevation unit configured to move the tensile plate towards the substrate and a tensile unit configured to apply a tensile force to the tensile plate to expand the tensile plate.

9 Claims, 10 Drawing Sheets

DEPOSITION APPARATUS AND DEPOSITION METHOD USING THE SAME

CROSS-REFERENCE TO RELATED APPLICATIONS

This application claims the benefit of Korean Patent Application No. 10-2014-0135961, filed on Oct. 8, 2014, in the Korean Intellectual Property Office, the disclosure of which is incorporated herein in its entirety by reference.

BACKGROUND

Field

The described technology generally relates to a deposition apparatus and a deposition method using the same.

Description of the Related Technology

Portable electronic devices are in wide use. For example, tablet computers are common examples of the portable electronic devices as well as miniaturized electronic devices such as mobile phones.

Such mobile electronic devices include a display panel to present visual information such as an image or a video. Recently, along with the miniaturization of other parts for driving image data, the portion of the display panel containing the pixels has gradually increased, and the capability of bending to have a predetermined angle in a planar state has also been developed.

To form the display panel described above, each layer of the display panel is formed by using various fabrication process technologies such as deposition, a photo masking process, and so forth.

In a process of forming a deposition material on a substrate by vaporizing and spraying, in general, a source part is formed on the bottom, a mask is formed on the source part, and a substrate is formed on the mask so that the deposition material which has passed through the mask is deposited on a lower surface of the substrate. In this case, the precision of a pattern of the deposition material deposited on the substrate may depend on a gap between the mask and the substrate. Specifically, the pattern of the deposition material is very important for a resolution and performance of a display unit and may affect the quality of a product.

Therefore, to increase the precision of the deposition material pattern, various apparatuses and methods have been developed.

Information disclosed in this Background section was already known to the inventors before achieving the described technology or is technical information acquired in the process of achieving the described technology. Therefore, it may contain information that does not form the prior art that is already known to the public in this country.

SUMMARY OF CERTAIN INVENTIVE ASPECTS

One inventive aspect is a deposition apparatus and a deposition method using the same.

Another aspect is a deposition apparatus for depositing a deposition material, which passes though slits formed in a mask, onto a substrate by aligning the substrate, the mask including: an electrostatic chuck; a tensile plate attached to the electrostatic chuck; an elevation unit for elevating the tensile plate such that the tensile plate moves in a direction towards the substrate; and a tensile unit for applying a tensile force to the tensile plate to expand the tensile plate.

The electrostatic chuck and the tensile plate may be formed to correspond to a downward curving shape of the substrate due to a self-weight.

The electrostatic chuck may be formed as a thin film.

The tensile plate may be formed of a thin-film metal or polymer.

The elevation unit may include: a first support part for supporting the tensile plate; and a first driving unit formed on the first support part to provide a driving force for elevating the tensile plate.

The tensile unit may include: a pressing part for expanding the tensile plate by contacting the tensile plate; and a second driving unit connected to the pressing part to provide a driving force to the pressing part.

The deposition apparatus may further include a connection part for connecting the elevation unit and the tensile unit, wherein the elevation unit includes: a second support part for supporting the connection part; and a third driving unit formed on the second support part to provide a driving force for elevating the connection part, and the pressing part and the second driving unit are formed on the connection part.

The deposition apparatus may further include an elevatable magnet part, wherein the magnet part is formed on a surface which is opposite to a surface of the tensile plate to which the electrostatic chuck is attached such that the magnet part presses the tensile plate.

Another aspect is a deposition method includes: aligning positions of a mask and a substrate; driving an elevation unit to lower a tensile plate in a direction towards the substrate such that an electrostatic chuck approaches the substrate; applying a voltage to the electrostatic chuck to attach the substrate to the electrostatic chuck; expanding the tensile plate by applying a tensile force to the tensile plate, wherein the applying is performed by a tensile unit; driving the elevation unit to lower the tensile plate such that the substrate adheres to the mask; and depositing a deposition material sprayed from a source part onto the substrate by passing the deposition material through the mask.

The electrostatic chuck and the tensile plate may be formed to correspond to a downward curving shape of the substrate due to a self-weight.

The electrostatic chuck may be formed as a thin film.

The tensile plate may be formed of a thin-film metal or polymer.

The elevation unit may include: a first support part for supporting the tensile plate; and a first driving unit formed on the first support part to provide a driving force for elevating the tensile plate.

The tensile unit may include: a pressing part for expanding the tensile plate by contacting the tensile plate; and a second driving unit connected to the pressing part to provide a driving force to the pressing part.

The deposition method may further include a connection part for connecting the elevation unit and the tensile unit, wherein the elevation unit includes: a second support part for supporting the connection part; and a third driving unit formed on the second support part to provide a driving force for elevating the connection part, and the pressing part and the second driving unit are formed on the connection part.

The deposition method may further include an elevatable magnet part, wherein the magnet part is formed on a surface which is opposite to a surface of the tensile plate to which the electrostatic chuck is attached such that the magnet part presses the tensile plate. The deposition method may further include pressing the tensile plate by the magnet part from a surface which is opposite to a surface of the tensile plate to which the electrostatic chuck is attached, between the expanding of the tensile plate and the driving of the elevation unit to lower the tensile plate such that the substrate adheres to the mask.

Another aspect is a deposition apparatus for depositing a deposition material onto a substrate, the deposition apparatus comprising: an electrostatic chuck; a tensile plate attached to and formed over the electrostatic chuck; an elevation unit configured to move the tensile plate towards the substrate; and a tensile unit configured to apply a tensile force to the tensile plate to expand the tensile plate.

In the above deposition apparatus, the electrostatic chuck and the tensile plate are formed to correspond to a downward curving shape of the substrate due to self-weight. In the above deposition apparatus, the electrostatic chuck is formed as a thin film. In the above deposition apparatus, the tensile plate is formed of a thin-film metal or polymer. In the above deposition apparatus, the elevation unit comprises: a first support part configured to support the tensile plate; and a first driving unit formed on the first support part to provide a driving force configured to move the tensile plate. In the above deposition apparatus, the tensile unit comprises: a pressing part configured to expand the tensile plate by contacting the tensile plate; and a second driving unit connected to the pressing part to provide a driving force to the pressing part.

The above deposition apparatus further comprises a connection part configured to connect the elevation unit and the tensile unit, wherein the elevation unit comprises: a second support part configured to support the connection part; and a third driving unit formed on the second support part to provide a driving force configured to move the connection part, and wherein the pressing part and the second driving unit are formed on the connection part. The above deposition apparatus further comprises an elevatable magnet part, wherein the magnet part is formed on a surface which is opposite to a surface of the tensile plate to which the electrostatic chuck is attached such that the magnet part presses the tensile plate.

Another aspect is a deposition method comprising: substantially aligning a mask with a substrate; driving an elevation unit to lower a tensile plate in a direction towards the substrate such that an electrostatic chuck approaches the substrate; applying a voltage to the electrostatic chuck to attach the substrate to the electrostatic chuck; applying a tensile force via a tensile unit to the tensile plate so as to expand the tensile plate; driving the elevation unit to lower the tensile plate such that the substrate adheres to the mask; and depositing a deposition material from a source part onto the substrate through the mask.

In the above deposition apparatus, the electrostatic chuck and the tensile plate are formed to correspond to a downward curving shape of the substrate due to self-weight. In the above deposition apparatus, the electrostatic chuck is formed as a thin film. In the above deposition apparatus, the tensile plate is formed of a thin-film metal or polymer. In the above deposition apparatus, the elevation unit comprises: a first support part configured to support the tensile plate; and a first driving unit formed on the first support part to provide a driving force configured to move the tensile plate. In the above deposition apparatus, the tensile unit comprises: a pressing part configured to expand the tensile plate by contacting the tensile plate; and a second driving unit connected to the pressing part to provide a driving force to the pressing part.

The above deposition apparatus further comprises a connection part configured to connect the elevation unit and the tensile unit, wherein the elevation unit comprises: a second support part configured to support the connection part; and a third driving unit formed on the second support part to provide a driving force configured to move the connection part, and wherein the pressing part and the second driving unit are formed on the connection part. The above deposition apparatus further comprises an elevatable magnet part, wherein the magnet part is formed on a surface which is opposite to a surface of the tensile plate to which the electrostatic chuck is attached such that the magnet part presses the tensile plate. The above deposition apparatus further comprising pressing the tensile plate by the magnet part from a surface which is opposite to a surface of the tensile plate to which the electrostatic chuck is attached, between the expanding of the tensile plate and the driving of the elevation unit to lower the tensile plate such that the substrate adheres to the mask.

Another aspect is a deposition apparatus for depositing a deposition material onto a substrate, the deposition apparatus comprising: an electrostatic chuck having a curved shape; a tensile plate attached to and formed over the electrostatic chuck, wherein the tensile plate has a curved shape corresponding to that of the electrostatic chuck; and an elevation unit configured to move the tensile plate towards the substrate.

The above deposition apparatus further comprises a tensile unit configured to apply a tensile force to the tensile plate to expand the tensile plate. In the above deposition apparatus, the electrostatic chuck is configured to be positioned to be closer to the substrate than the tensile plate, and wherein electrostatic chuck and the tensile plate are curved toward the substrate.

DETAILED DESCRIPTION OF CERTAIN INVENTIVE EMBODIMENTS

Figure 1:
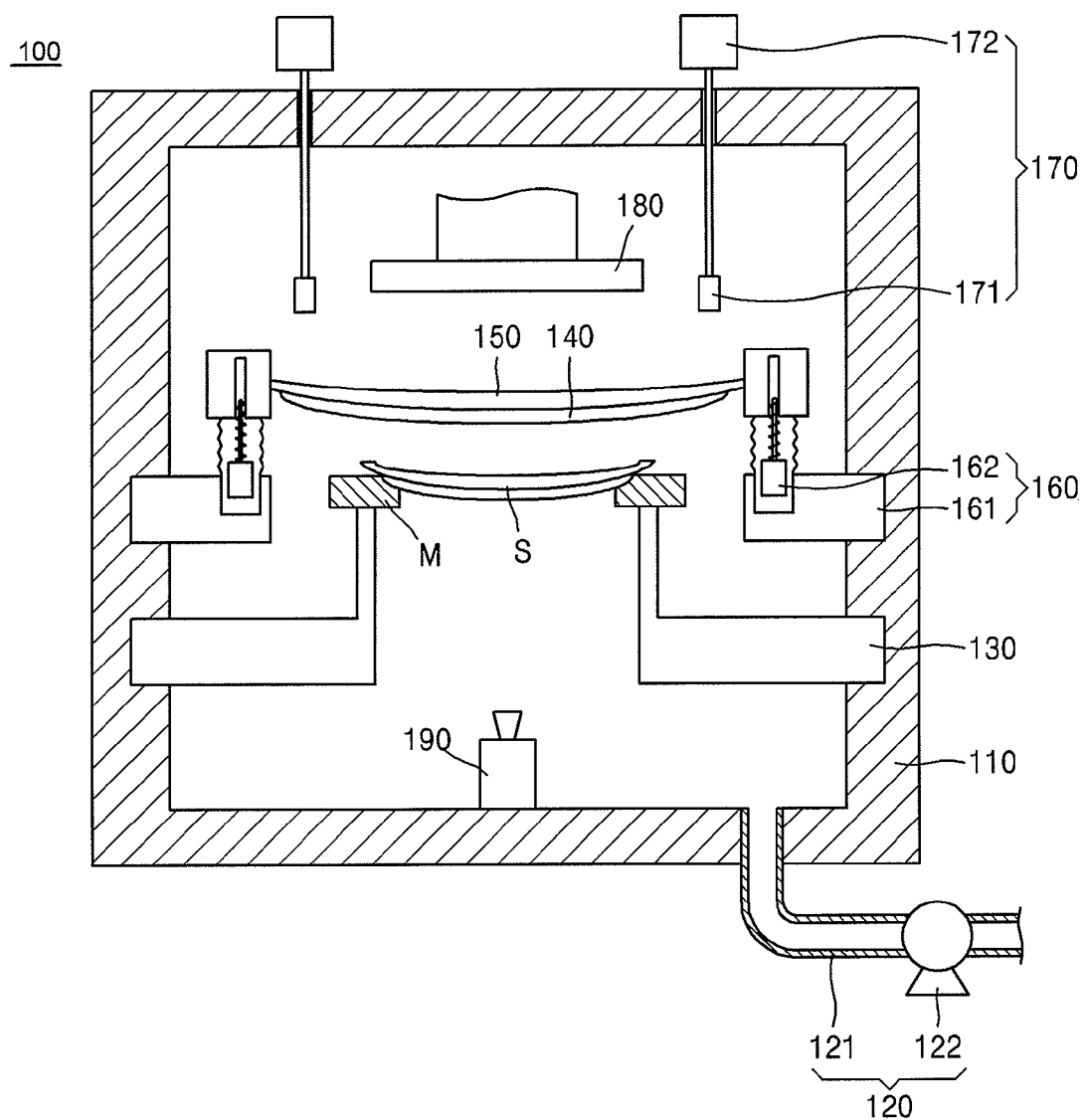
FIG. 1 is a conceptual diagram of a deposition apparatus according to an exemplary embodiment.

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description. It will be understood that although the terms "first", "second", etc. may be used herein to describe various components, these components should not be limited by these terms. These components are only used to distinguish one component from another. As used herein, the singular forms "a," "an" and "the" are intended to include the plural forms as well, unless the context clearly indicates otherwise. It will be further understood that the terms "comprises" and/or "comprising" used herein specify the presence of stated features or components, but do not preclude the presence or addition of one or more other features or components.

Sizes of elements in the drawings may be exaggerated for convenience of explanation. In other words, since sizes and thicknesses of components in the drawings are arbitrarily illustrated for convenience of explanation, the following exemplary embodiments are not limited thereto. When a certain exemplary embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items. Expressions such as "at least one of," when preceding a list of elements, modify the entire list of elements and do not modify the individual elements of the list.

The described technology will now be described more fully with reference to the accompanying drawings, in which exemplary embodiments of the described technology are shown. Like reference numerals in the drawings denote like elements, and thus their repetitive description will be omitted. In this disclosure, the term "substantially" includes the meanings of completely, almost completely or to any significant degree under some applications and in accordance with those skilled in the art. Moreover, "formed on" can also mean "formed over." The term "connected" includes an electrical connection.

Referring to FIG. 1, the deposition apparatus 100 includes a chamber 110, a pressure control unit or pressure controller 120, a mask holder 130, an electrostatic chuck 140, a tensile plate 150, an elevation unit 160, a tensile unit 170, a magnet part 180, and a deposition source 190. Depending on the embodiment, certain elements may be removed from or additional elements may be added to the deposition apparatus illustrated in any of the figures, such as FIGS. 1 and 5. Furthermore, two or more elements may be combined into a single element, or a single element may be realized as multiple elements.

A space is formed inside the chamber 110 of the deposition apparatus 100, and an internal pressure of the chamber 110 may be variable. Specifically, the pressure control unit 120 is connected to the chamber 110 to control the internal pressure of the chamber 110. The pressure control unit 120 includes a conduit pipe 121 connected to the chamber 110 and a pump 122 mounted on the conduit pipe 121. The internal pressure of the chamber 110 may be controlled by discharging gas and the like inside the chamber 110 to the outside through the conduit pipe 121 according to an operation of the pump 122.

In some embodiments, as shown in FIG. 1, the mask holder 130 is mounted inside the chamber 110 and supports a mask M. However, the mask holder 130 may be mounted to be substantially linearly movable in the chamber 110.

When the mask holder 130 is mounted to be substantially linearly movable in the chamber 110, the mask holder 130 may be connected to a separate elevation device (not shown). For example, the mask holder 130 includes any device or structure, such as a motor or a cylinder, connected to the mask holder 130 to be able to provide a driving force to the mask holder 130.

A substrate S may be introduced into the chamber 110 from the outside by a robot arm (not shown). The substrate S introduced into the chamber 110 is formed on the mask M and aligned by an alignment device (not shown), and the alignment between the mask M and the substrate S may be performed according to circumstances in all operations of a deposition process.

The electrostatic chuck 140 attaches the substrate S thereto and the tensile plate 150 attached to the electrostatic chuck 140. The electrostatic chuck 140 and the tensile plate 150 may be formed as a thin film. Specifically, the tensile plate 150 may be formed of a thin-film metal or polymer.

The tensile plate 150 may be connected to the elevation unit 160 to be described below in a downward curving shape or concave in a direction towards the substrate S so as to correspond to a downward curving shape of the substrate S (or a concave shape with respect to the tensile plate 150). The electrostatic chuck 140 may also be attached to the tensile plate 150 in a downward curving shape in the direction towards the substrate S.

The reason why the electrostatic chuck 140 and the tensile plate 150 are formed in a downward curving shape at the center thereof in the direction towards the substrate S will now be described.

During a deposition process, a deposition material is deposited onto the substrate S by passing through slits formed in the mask M. If the mask M and the substrate S do not adhere to each other during the deposition process, the deposition material may be deposited onto a non-desired zone of the substrate S, i.e., a dead zone, thereby causing a defective display. This phenomenon is referred to as a shadow effect. To manufacture a high-resolution display device, this shadow effect is necessarily reduced or removed. Therefore, to reduce or remove the shadow effect, it is necessary to increase the adherence between the substrate S and the mask M.

A defect in a display can be reduced by increasing the adherence between the substrate S and the mask M and substantially evenly disposing the substrate S and the mask M. As shown in FIG. 1, the substrate S generally curves downward in a direction towards the deposition source 190 due to self-weight. In addition, the mask M adhering to the substrate S also curves downward due to self-weight as well as the weight of the substrate S. When the deposition process is performed in a state where the substrate S and the mask M curve downward, the probability of depositing the deposition material onto the dead zone of the substrate S increases the less the substrate S and the mask M adhere to each other, and accordingly, the probability of a defective display also increases.

Therefore, to accurately deposit the deposition material onto the substrate S as designed by minimizing the shadow effect, one embodiment is to adhere the substrate S and the mask M to each other as much as possible, and to provide the substrate S and the mask M having a flat surface towards the deposition source 190 in an adhering state.

As described above, the electrostatic chuck 140 functions to attach the substrate S thereto. If the electrostatic chuck 140 is formed to have a flat surface instead of curving downward to correspond to the downward curving shape of the substrate S as shown in FIG. 1, when a voltage is applied to the electrostatic chuck 140 to attach the substrate S to the electrostatic chuck 140, the center portion of the substrate S may not be closely attached to the electrostatic chuck 140.

Therefore, as shown in FIG. 1, when the electrostatic chuck 140 having a downward curving shape corresponding to the downward curving shape of the substrate S due to self-weight is provided and the substrate S is attached to the electrostatic chuck 140, the entire zone of the substrate S may be substantially uniformly attached to the electrostatic chuck 140. The electrostatic chuck 140 having the characteristic described above is attached to the tensile plate 150, and the tensile plate 150 is also formed to correspond to the shape of the electrostatic chuck 140.

The elevation unit 160 elevates the tensile plate 150 to move the tensile plate 150 in the direction towards the substrate S and the tensile unit 170 for applying a tensile force to the tensile plate 150 to expand the tensile plate 150.

The elevation unit 160 can elevate the tensile plate 150 such that the tensile plate 150 and the electrostatic chuck 140 attached to the tensile plate 150 are elevated in the direction towards the substrate S. The elevation unit 160 may include a first support part 161 for supporting the tensile plate 150 and a first driving unit 162 formed on the first support part 161 to provide a driving force for elevating the tensile plate 150. Herein, the first driving unit 162 may include any device or structure, such as a motor or a pump, for moving an object.

Figure 2:
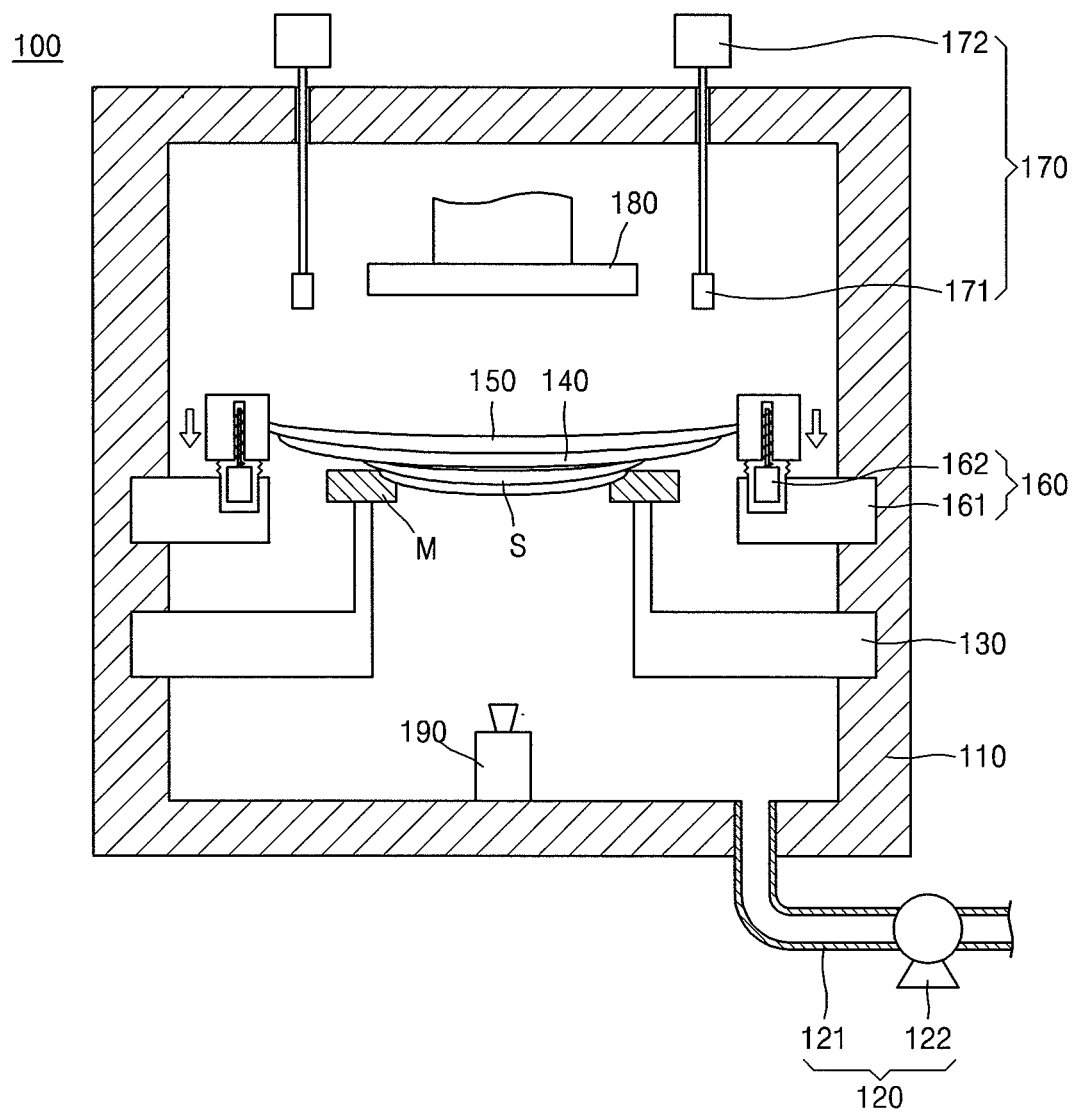
FIG. 2 is an operation diagram illustrating a first operation of a portion of the deposition apparatus of FIG. 1.

FIG. 2 shows that the elevation unit 160 lowers the tensile plate 150 such that the tensile plate 150 approaches the substrate S. As described above, the elevation unit 160 may lower the tensile plate 150 by driving the first driving unit 162, and the electrostatic chuck 140 attached to the lowered tensile plate 150 is also lowered according to the descent of the elevation unit 160, and accordingly, the electrostatic chuck 140 contacts the substrate S. In this case, since the electrostatic chuck 140 has a downward curving shape to correspond to the downward curving shape of the substrate S, the electrostatic chuck 140 may substantially uniformly contact an upper surface of the substrate S of which the center portion curves downward due to self-weight.

The tensile unit 170 may include a pressing part 171 for pressing the tensile plate 150 to expand the tensile plate 150 and a second driving unit 172 connected to the pressing part 171 to provide a driving force to the pressing part 171.

Figure 3:
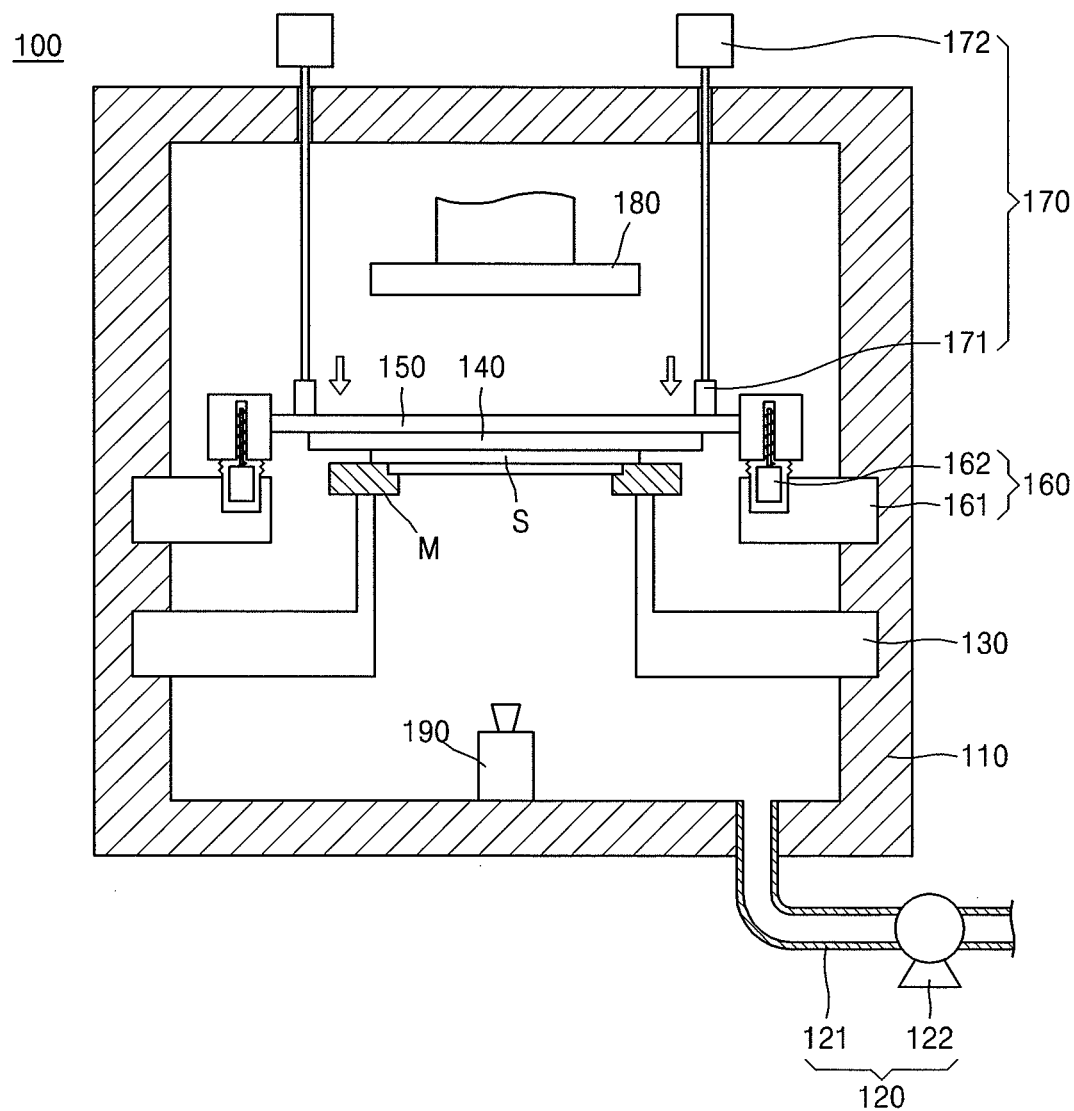
FIG. 3 is an operation diagram illustrating a second operation of a portion of the deposition apparatus of FIG. 1.

FIG. 3 shows that the second driving unit 172 operates to lower the pressing part 171 and the lowered pressing part 171 presses an edge area of the tensile plate 150. As shown in FIG. 3, when the pressing part 171 presses the edge area of the tensile plate 150, a force of pressing the edge area of the tensile plate 150 is also exerted to an edge area of the electrostatic chuck 140 attached to the tensile plate 150, an edge area of the substrate S attached to the electrostatic chuck 140, and an edge area of the mask M supporting the substrate S.

In some embodiments, when the pressing part 171 presses the edge area of the tensile plate 150, the tensile plate 150 of which a central area curves downward due to self-weight is substantially evenly flattened. Furthermore, according to the flatness of the tensile plate 150, the electrostatic chuck 140 attached to the tensile plate 150, the substrate S attached to the electrostatic chuck 140, and the mask M adhered to the substrate S can all be substantially evenly flattened, thereby increasing the flatness of the substrate S and the mask M and also increasing an adhesion force between the substrate S and the mask M. In this state, when the deposition material is sprayed towards the substrate S such that the deposition material is deposited onto the substrate S through a pattern formed in the mask M, a deposition error due to the shadow effect may be minimized.

In addition, besides the components described above, the deposition apparatus 100 may further include the magnet part 180 elevatably formed on a surface which is opposite to a surface of the tensile plate 150 to which the electrostatic chuck 140 is attached.

Figure 4:
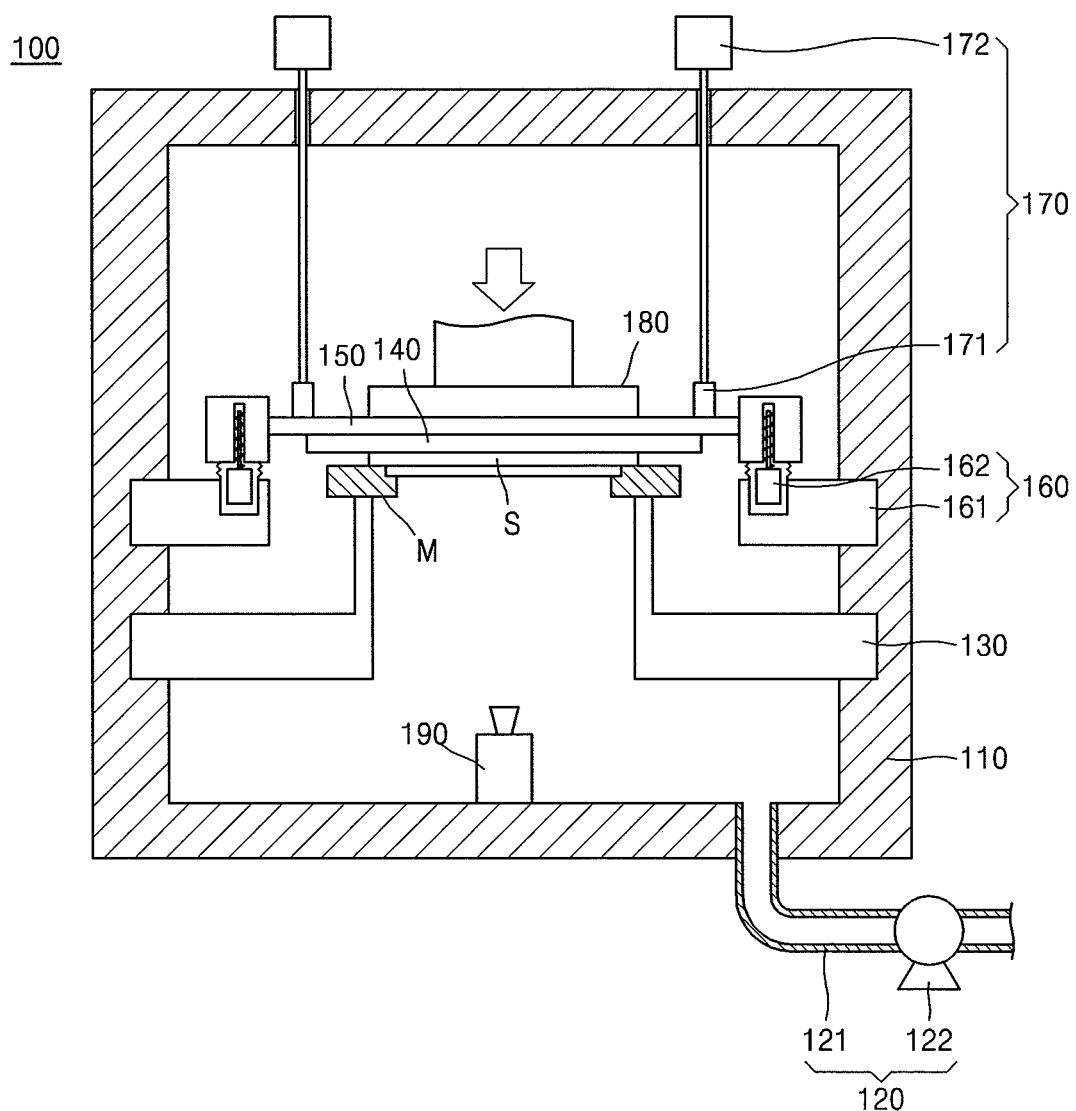
FIG. 4 is an operation diagram illustrating a third operation of a portion of the deposition apparatus of FIG. 1.

Referring to FIG. 4, although not shown, the magnet part 180 is formed to be elevatable by being connected to a separate driving source (not shown) capable of elevating the magnet part 180. When the magnet part 180 moves in a direction towards the tensile plate 150, the magnet part 180 which has moved towards the tensile plate 150 may apply a magnetic force to the mask M such that the mask M is adhered to the substrate S. Furthermore, the magnet part 180 may further descend from a position where the magnet part 180 contacts the tensile plate 150, to press the tensile plate 150.

When the above-described procedures are completed, the deposition material may be deposited onto the substrate S according to the pattern formed in the mask M by spraying the deposition material from the deposition source 190 and passing the sprayed deposition material through the mask M. At this time, the chamber 110 may be maintained in a vacuum state.

Figure 5:
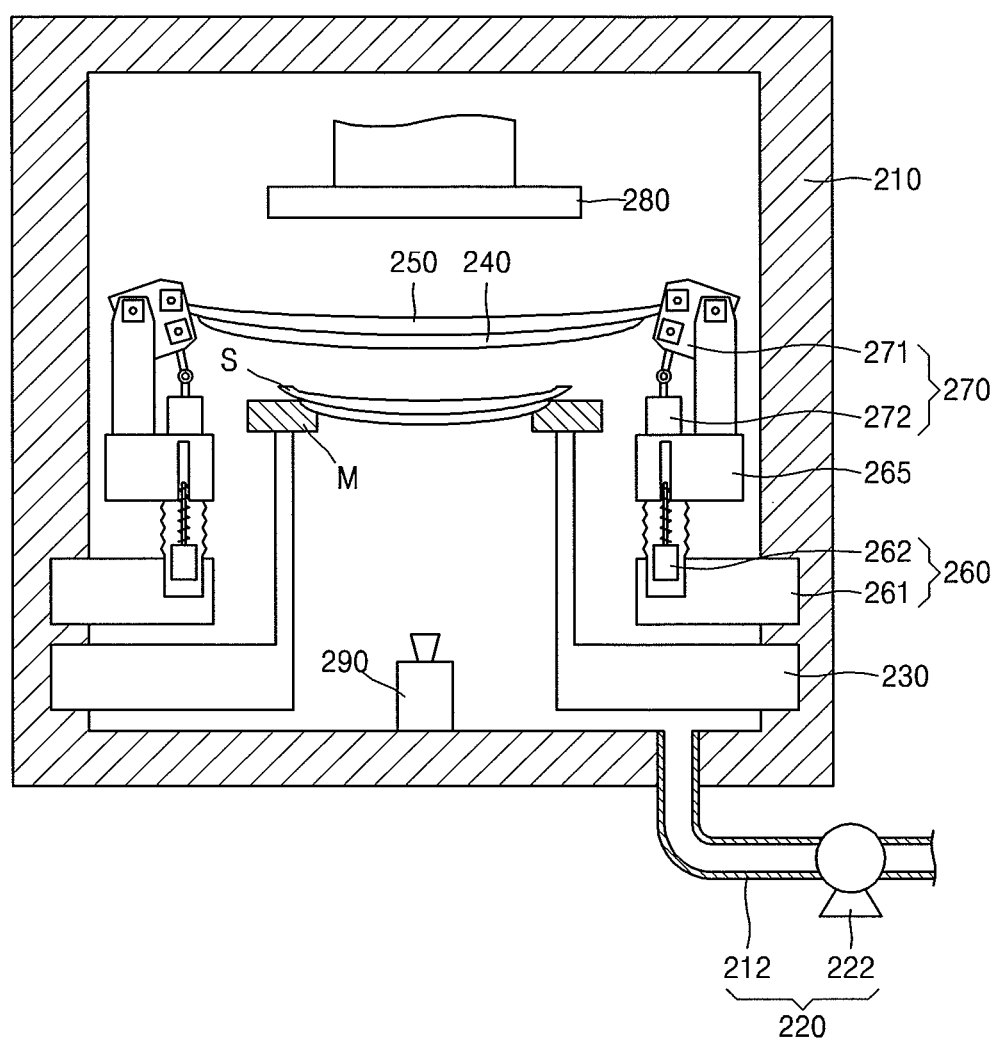
FIG. 5 is a conceptual diagram of a deposition apparatus according to another exemplary embodiment.

Referring to FIG. 5, a deposition apparatus 200 according to the present exemplary embodiment includes all the components of the deposition apparatus 200 of FIG. 1. The deposition apparatus 200 further includes a connection part 265 for connecting an elevation unit 260 and a tensile unit 270, wherein the elevation unit 260 includes a second support part 261 for supporting the connection part 265 and a third driving unit 262 formed on the second support part 261 to provide a driving force for elevating the connection part 265, and a pressing part 271 and a second driving unit 272 are formed on the connection part 265.

An operation of the deposition apparatus 200 according to another exemplary embodiment will now be described in detail with reference to FIGS. 6 to 9.

Figure 6:
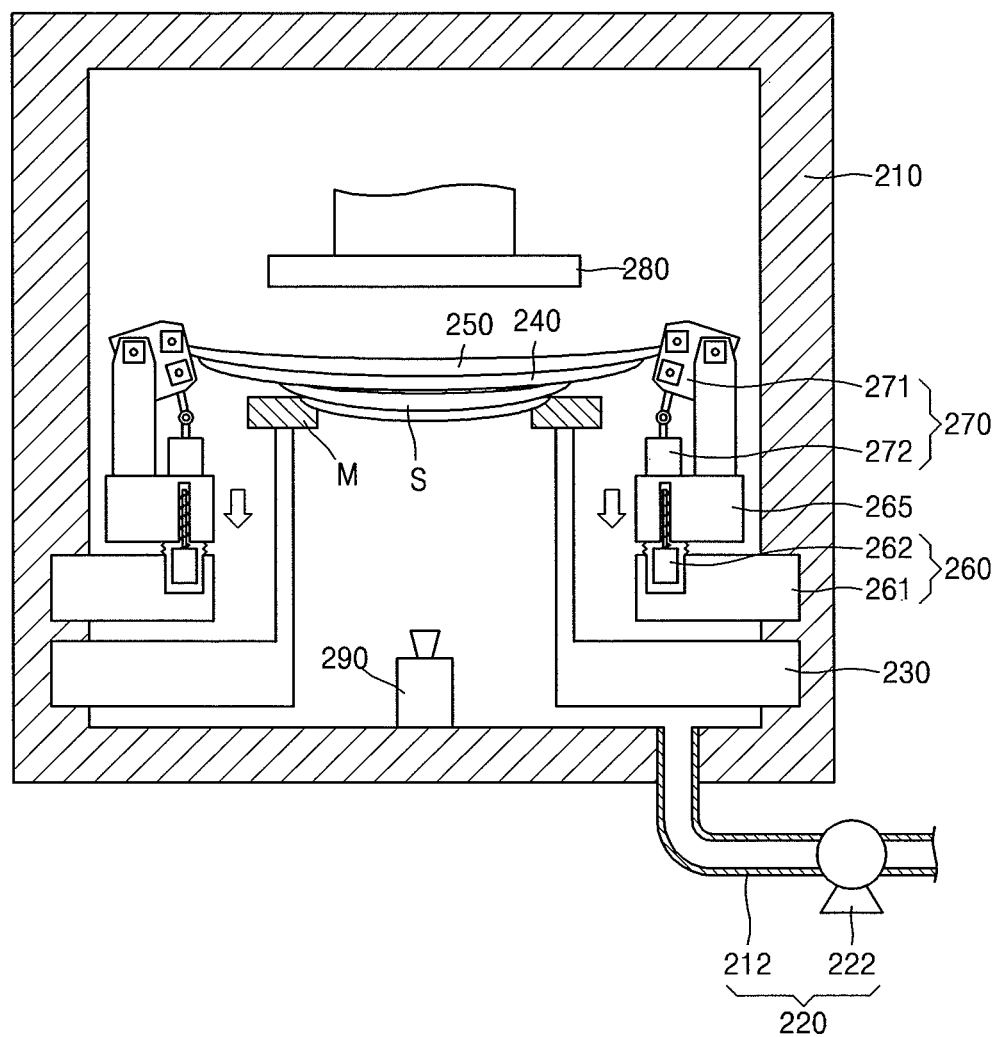
FIG. 6 is an operation diagram illustrating a first operation of a portion of the deposition apparatus of FIG. 5.

First, FIG. 6 shows that the third driving unit 262 of the elevation unit 260 operates such that the connection part 265 is lowered. When the connection part 265 is lowered, a tensile unit 270 formed on the connection part 265 is also lowered, and a tensile plate 250 connected to the pressing part 271 and an electrostatic chuck 240 attached to the tensile plate 250 are also lowered. The lowered electrostatic chuck 240 contacts the upper surface of the substrate S. Since the electrostatic chuck 240 has a downward curving shape to correspond to the downward curving shape of the substrate S, when a voltage is applied to the electrostatic chuck 240, the upper surface of the substrate S of which the central portion curves downward due to self-weight uniformly contacts the electrostatic chuck 240.

Figure 7:
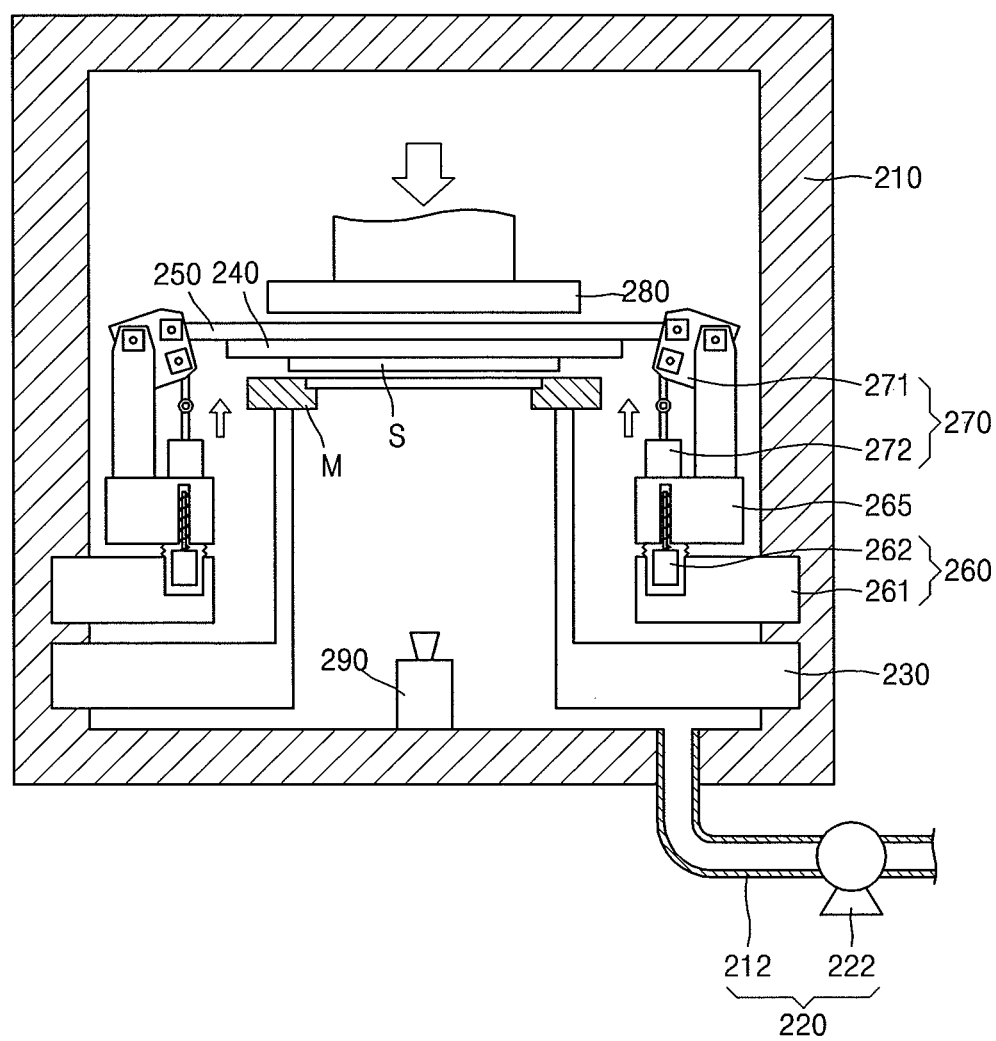
FIG. 7 is an operation diagram illustrating a second operation of a portion of the deposition apparatus of FIG. 5.

FIG. 7 shows that the second driving unit 272 operates to rotate clockwise the pressing part 271 connected to the tensile plate 250 such that a tensile force is applied to the tensile plate 250. As shown in FIG. 7, when the pressing part 271 applies a tensile force to an edge area of the tensile plate 250, the tensile plate 250 is substantially evenly flattened, and the electrostatic chuck 240 attached to the tensile plate 250, the substrate S attached to the electrostatic chuck 240, and the mask M supporting the substrate S are also substantially evenly flattened.

When the pressing part 271 applies a tensile force to the edge area of the tensile plate 250, the tensile plate 250 of which a central area curves downward due to self-weight can be substantially evenly flattened. According to the flatness of the tensile plate 250, the electrostatic chuck 240 attached to the tensile plate 250, the substrate S attached to the electrostatic chuck 240, and the mask M adhered to the substrate S can all be substantially evenly flattened, thereby increasing the flatness of the substrate S and the mask M and also increasing an adhesion force between the substrate S and the mask M.

Figure 8:
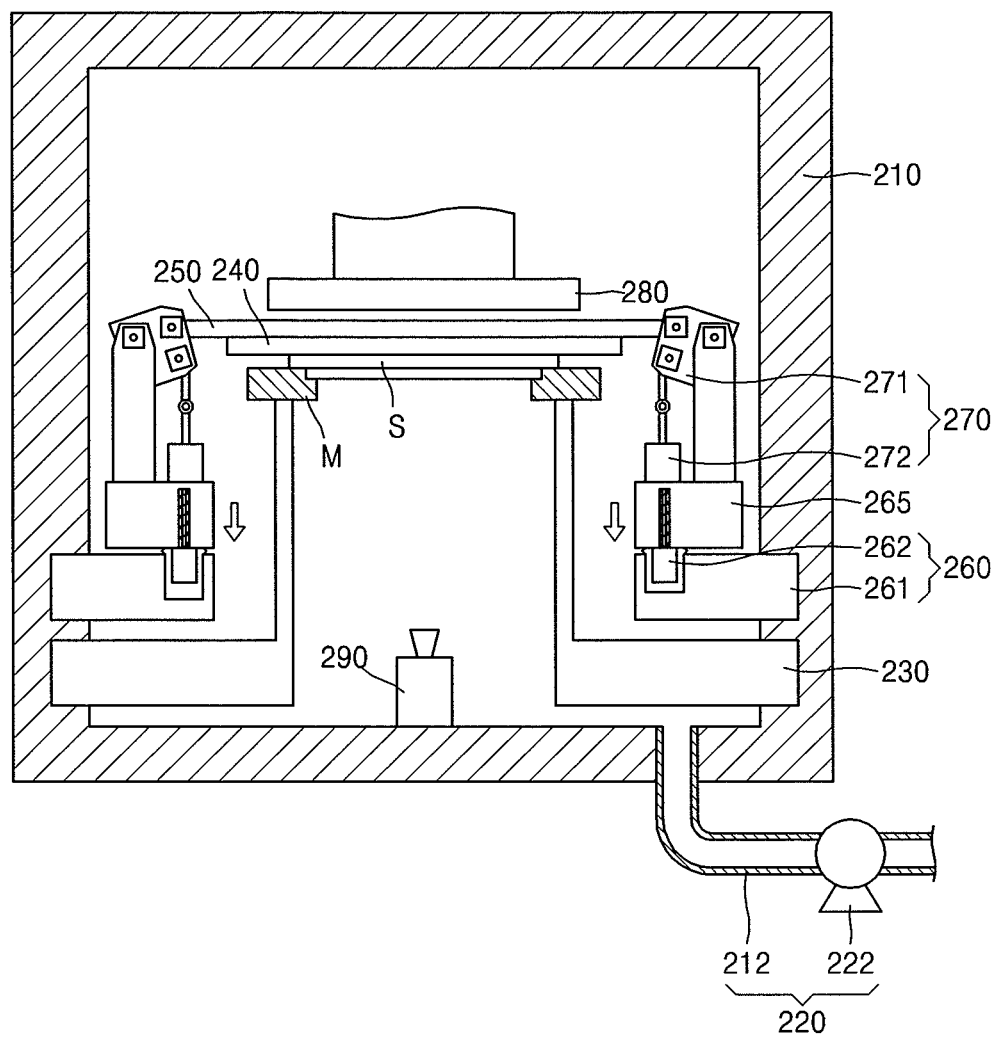
FIG. 8 is an operation diagram illustrating a third operation of a portion of the deposition apparatus of FIG. 5.

FIG. 8 shows that in a state where the pressing part 271 applies a tensile force to the tensile plate 250 to expand the tensile plate 250, the connection part 265 is further lowered such that the tensile plate 250 further presses the substrate S and the mask M. As shown in FIG. 8, when the tensile plate 250 is further lowered, an adhesion force between the substrate S and the mask M may be further increased.

In addition, besides the components described above, the deposition apparatus 200 may further include a magnet part 280 elevatably formed on a surface which is opposite to a surface of the tensile plate 250 to which the electrostatic chuck 240 is attached.

Figure 9:
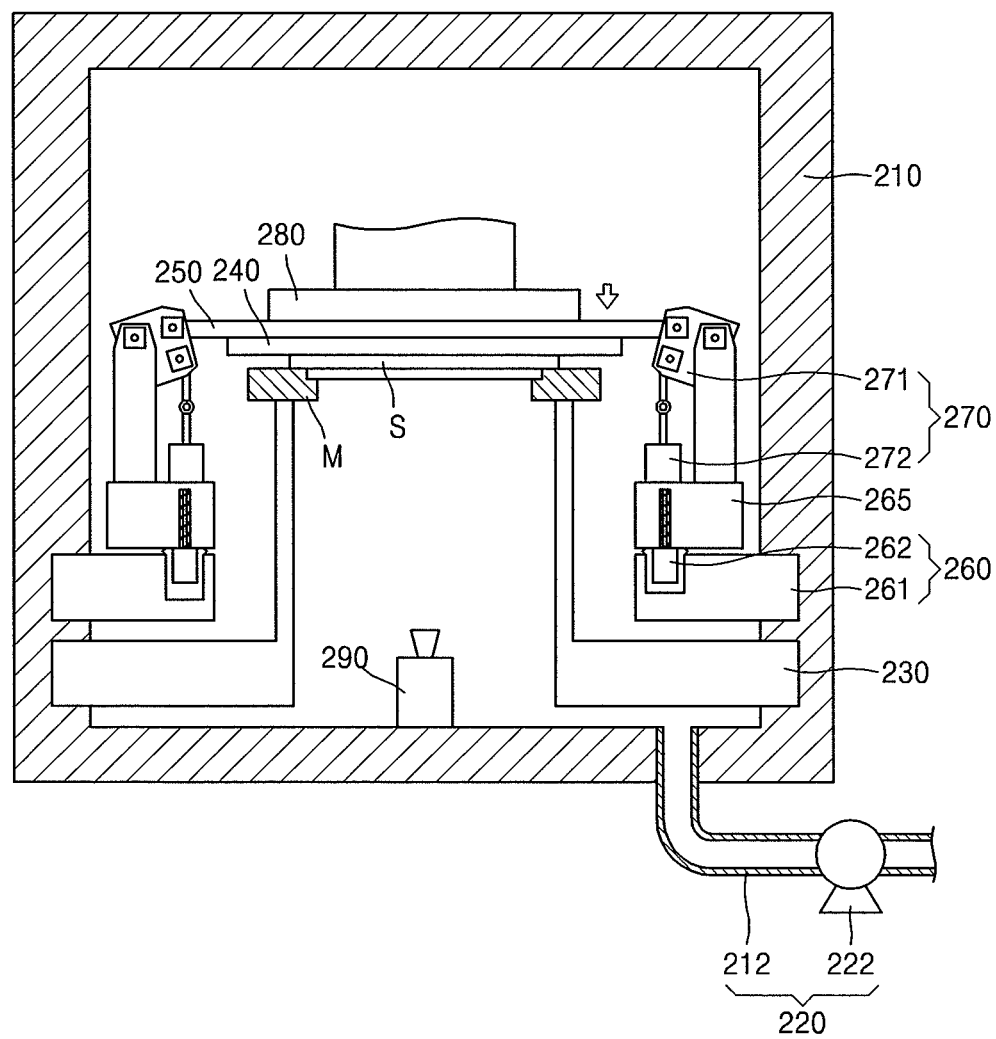
FIG. 9 is an operation diagram illustrating a fourth operation of a portion of the deposition apparatus of FIG. 5.

FIG. 9 shows that the magnet part 280 is lowered in a direction towards the tensile plate 250 such that the magnet part 280 contacts the tensile plate 250. The magnet part 280 may apply a magnetic force to the mask M to further adhere the mask M to the substrate S, and the magnet part 280 may be further lowered from a position where the magnet part 280 contacts the tensile plate 250 such that the magnet part 280 presses the tensile plate 250.

When the above-described procedures are completed, the deposition material may be deposited onto the substrate S according to the pattern formed in the mask M by spraying the deposition material from a deposition source 290 and passing the sprayed deposition material through the mask M. At this time, a chamber 210 may be maintained in a vacuum state.

When the deposition material is deposited onto the substrate S after disposing the substrate S and the mask M as described above, the performance of a display panel (not shown) may depend on how accurately the deposition material is deposited onto the substrate S according to the pattern formed in the mask M.

In some embodiments, when a size of the substrate S is large, the substrate curves downward due to self-weight of the substrate S, and it may be important how well the downward curving is solved to perform a deposition process in a state where the substrate S is flattened.

Generally, in an apparatus for depositing the deposition material onto the substrate S, a structure supporting the substrate S has a form of simply holding the substrate S, but according to the structure, a phenomenon whereby the central portion of the substrate S curves downward due to self-weight of the substrate S may occur.

However, according to the deposition apparatuses 100 and 200 according to the exemplary embodiments, the substrate S may be substantially evenly flattened due to the shapes of the electrostatic chucks 140 and 240 and the tensile plates 150 and 250 and the arrangement and driving thereof. Furthermore, the deposition material may be deposited onto the substrate S in an accurate pattern according to the pattern in the mask M by performing a deposition process in a structure in which the flatness of and an adhesion force between the substrate S and the mask M are improved.

Figure 10:
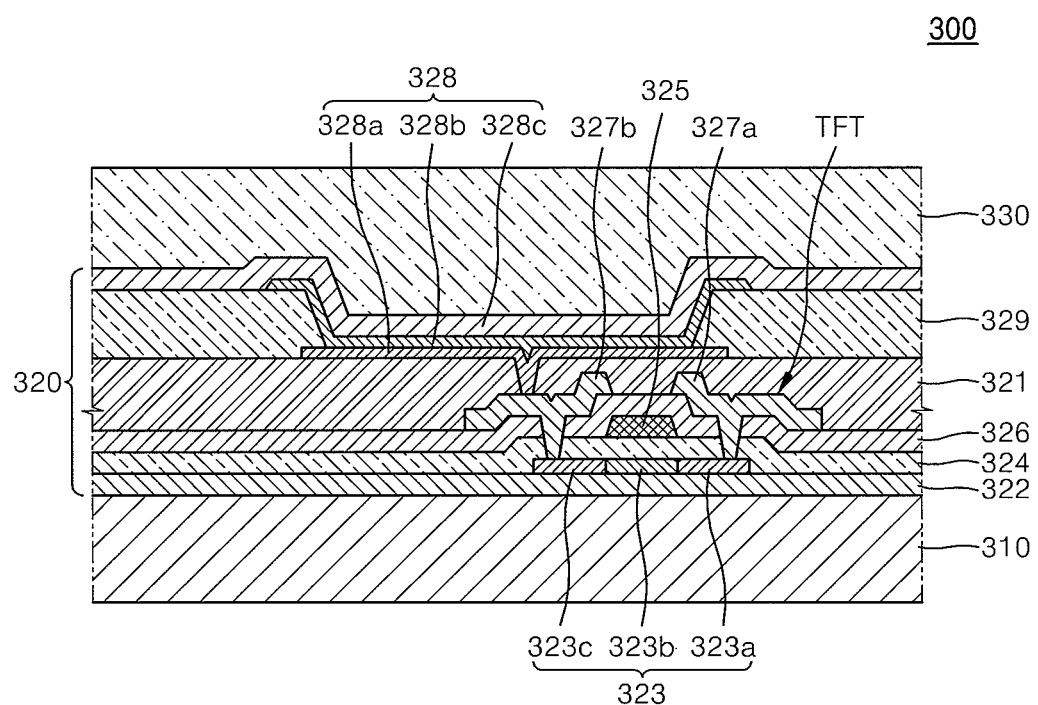
FIG. 10 is a cross-sectional view of a display panel manufactured by the deposition apparatus of FIG. 1 or 5, according to an exemplary embodiment.

FIG. 10 is a cross-sectional view of a display panel 300 manufactured by the deposition apparatus 100 or 200 of FIG. 1 or 5, according to an exemplary embodiment.

Although there are various layers to be formed by performing a deposition process when the display panel 300 is manufactured, a case of forming an intermediate layer will now be mainly described in detail for convenience of description.

Referring to FIG. 10, the display panel 300 includes a substrate 310, an emission unit 320, and a thin-film encapsulation layer 330. A method of manufacturing the display panel 300 will now be described. First, the emission unit 320 may be formed in the substrate 310. The emission unit 320 may include a thin-film transistor TFT, a passivation layer 321 formed to cover the thin-film transistor TFT, and an organic light-emitting device (OLED) 328 formed on the passivation layer 321.

The substrate 310 may be formed of a glass material. However, the present exemplary embodiment is not necessarily limited thereto, and a plastic material or a metallic material such as stainless steel (SUS) or titanium (Ti) may be used.

A buffer layer 322 formed of an organic compound and/or an inorganic compound is further formed on an upper surface of the substrate 310. That is, the buffer layer 322 may be formed of silicon oxide ($SiO_x$) ($x \geq 1$) or silicon nitride ($SiN_x$) ($x \geq 1$).

An active layer 323 arranged in a predetermined pattern is formed on the buffer layer 322, and thereafter, the active layer 323 is buried by a gate insulating layer 324. The active layer 323 includes a source region 323a and a drain region 323c and further includes a channel region 323b between the source region 323a and the drain region 323c. The active layer 323 may be formed to contain various materials. For example, the active layer 323 contains an inorganic semiconductor material such as amorphous silicon or crystalline silicon. As another example, the active layer 323 contains an oxide semiconductor. As another example, the active layer 323 contains an organic semiconductor material. However, hereinafter, a case where the active layer 323 is formed of amorphous silicon will be mainly described for convenience of description.

The active layer 323 may be formed by forming an amorphous silicon layer on the buffer layer 322, forming a polycrystalline silicon layer by crystallizing the amorphous silicon layer, and patterning the polycrystalline silicon layer. The source region 323a and the drain region 323c of the active layer 323 are doped with impurities according to a thin-film transistor type such as a driving thin-film transistor (not shown), a switching thin-film transistor (not shown), or the like.

A gate electrode 325 corresponding to the active layer 323 and an interlayer insulating layer 326 which buries the gate electrode 325 are formed on an upper surface of the gate insulating layer 324.

Contact holes are formed in the interlayer insulating layer 326 and the gate insulating layer 324, and a source electrode 327a and a drain electrode 327b are formed on the interlayer insulating layer 326 such that the source electrode 327a and the drain electrode 327b contact the source region 323a and the drain region 323c, respectively.

Since a reflective layer (not shown) is formed substantially at the same time the source electrode 327a and the drain electrode 327b are formed, the source electrode 327a and the drain electrode 327b may be formed of a material having good electrical conductivity and with a thickness that allows light reflection.

The passivation layer 321 is formed on the thin-film transistor TFT and the reflective layer, and a pixel electrode 328a of the OLED 328 is formed on the passivation layer 321. The pixel electrode 328a contacts the drain electrode 327b of the thin-film transistor TFT through a via hole (no reference numeral) formed in the passivation layer 321. The passivation layer 321 may be formed of an inorganic material and/or an organic material and in a single layer or two or more layers. The passivation layer 321 may be formed as a planarization layer to make an upper surface thereof even regardless of unevenness of a lower layer or formed to be uneven along with the unevenness of the lower layer. The passivation layer 321 may be formed of a transparent insulating layer to exhibit a resonance effect.

After forming the pixel electrode 328a on the passivation layer 321, a pixel-defining layer 329 is formed of an organic material and/or an inorganic material so as to cover the pixel electrode 328a on the passivation layer 321 and is open to expose the pixel electrode 328a.

An intermediate layer 328b and an opposite electrode 328c are formed on at least the pixel electrode 328a.

The pixel electrode 328a functions as an anode electrode, and the opposite electrode 328c functions as a cathode electrode, or vice versa.

The pixel electrode 328a and the opposite electrode 328c are insulated from each other by the intermediate layer 328b, and an organic emission layer (not shown) emits light by applying voltages having different polarities to the intermediate layer 328b.

The intermediate layer 328b may include the organic emission layer. As another selective example, the intermediate layer 328b may include the organic emission layer and further include at least one selected from the group consisting of a hole injection layer (HIL), a hole transport layer (HTL), an electron transport layer (ETL), and an electron injection layer (EIL). The present exemplary embodiment is not limited thereto, and the intermediate layer 328b may include the organic emission layer and further include other various function layers.

One unit pixel includes a plurality of sub-pixels, wherein the sub-pixels may emit lights of various colors. For example, the sub-pixels may be sub-pixels for emitting red, green, and blue lights or sub-pixels for emitting red, green, blue, and white lights.

The sub-pixels may include intermediate layers 328b having organic emission layers for emitting lights of various colors, respectively. For example, the sub-pixels include intermediate layers 328b having organic emission layers for emitting red, green, and blue lights, respectively.

As another example, the sub-pixels for emitting lights of various colors may include the intermediate layer 328b having an organic emission layer for emitting a same light, e.g., white light, and include a color converting layer for converting the white light into light of a predetermined color or a color filter.

The intermediate layer 328b which emits the white light may have various structures. For example, the intermediate layer 328b may have a structure in which at least an emission material which emits red light, an emission material which emits green light, and an emission material which emits blue light are stacked.

As another example, to emit the white light, the intermediate layer 328b may have a structure in which at least an emission material which emits red light, an emission material which emits green light, and an emission material which emits blue light are mixed.

The red, green, and blue colors are only illustrative, and the present exemplary embodiment is not limited thereto. That is, only if white light is emitted may other various combinations of colors be used besides the combination of the red, green, and blue colors.

The thin-film encapsulation layer 330 may include a plurality of inorganic layers or include an inorganic layer and an organic layer.

The organic layer of the thin-film encapsulation layer 330 can be formed of a polymer and may be a single layer or a stack layer formed of polyethylene terephthalate, polyimide, polycarbonate, epoxy, polyethylene, or polyacrylate. Furthermore, the organic layer may be formed of polyacrylate, and in detail, may include a polymer of a monomer composition including a diacrylate-group monomer and a triacrylate-group monomer. A monoacrylate-group monomer may be further included in the monomer composition. In addition, a well-known photoinitiator such as thermoplastic polyolefin (TPO) may be further included in the monomer composition, but the present embodiment is not limited thereto.

The inorganic layer of the thin-film encapsulation layer 330 may be a single layer or a stack layer including a metal oxide or a metal nitride. In detail, the inorganic layer may include silicon nitride ($SiN_x$), aluminum oxide ($Al_2O_3$), silicon oxide ($SiO_2$), or titanium oxide ($TiO_2$).

The uppermost layer of the thin-film encapsulation layer 330, which is exposed to the outside, may be formed as an inorganic layer to prevent infiltration of humidity to the OLED 328.

The thin-film encapsulation layer 330 may include at least one sandwich structure in which at least one organic layer is inserted between at least two inorganic layers. As another example, the thin-film encapsulation layer 330 may include at least one sandwich structure in which at least one inorganic layer is inserted between at least two organic layers. As another example, the thin-film encapsulation layer 330 may include a sandwich structure in which at least one organic layer is inserted between at least two inorganic layers and a sandwich structure in which at least one inorganic layer is inserted between at least two organic layers.

The thin-film encapsulation layer 330 may include a first inorganic layer, a first organic layer, and a second inorganic layer in order from an upper part of the OLED 328.

As another example, the thin-film encapsulation layer 330 includes the first inorganic layer, the first organic layer, the second inorganic layer, a second organic layer, and a third inorganic layer in order from the upper part of the OLED 328.

As another example, the thin-film encapsulation layer 330 includes the first inorganic layer, the first organic layer, the second inorganic layer, the second organic layer, the third inorganic layer, a third organic layer, and a fourth inorganic layer in order from the upper part of the OLED 328.

A halogenated metal layer including lithium fluoride (LiF) may be additionally included between the OLED 328 and the first inorganic layer. The halogenated metal layer may prevent the OLED 328 from being damaged when the first inorganic layer is formed by using a sputtering method.

The first organic layer may be formed to have a smaller area than the second inorganic layer, and the second organic layer may also be formed to have a smaller area than the third inorganic layer.

As another example, the first organic layer is formed to be substantially fully covered by the second inorganic layer, and the second organic layer is foamed to be substantially fully covered by the third inorganic layer.

As described above, according to a deposition apparatus and a deposition method using the same according to at least one of the disclosed embodiments, a deposition material may be precisely deposited onto a substrate by minimizing the downward curving of the substrate during a deposition process.

It should be understood that the exemplary embodiments described herein should be considered in a descriptive sense only and not for purposes of limitation. Descriptions of features or aspects within each exemplary embodiment should typically be considered as available for other similar features or aspects in other exemplary embodiments.

While the inventive technology has been described with reference to the figures, it will be understood by those of ordinary skill in the art that various changes in form and details may be made therein without departing from the spirit and scope as defined by the following claims.

What is claimed is:

1. A deposition method comprising:
   substantially aligning a mask with a substrate;
   driving an elevation unit to lower a tensile plate in a direction towards the substrate such that an electrostatic chuck approaches the substrate;
   applying a voltage to the electrostatic chuck to attach the substrate to the electrostatic chuck;
   applying a tensile force via a tensile unit to the tensile plate so as to expand the tensile plate;
   driving the elevation unit to lower the tensile plate such that the substrate adheres to the mask; and
   depositing a deposition material from a source part onto the substrate through the mask,
   wherein the tensile unit comprises a pressing part configured to press opposing edges of the tensile plate to substantially even flatten the tensile plate.

2. The deposition method of claim 1, wherein the electrostatic chuck and the tensile plate have a shape corresponding to a downward curving shape of the substrate due to self-weight.

3. The deposition method of claim 1, wherein the electrostatic chuck is formed as a thin film.

4. The deposition method of claim 1, wherein the tensile plate is formed of a thin-film metal or polymer.

5. The deposition method of claim 1, wherein the elevation unit comprises:
   a first support part configured to support the tensile plate; and
   a first driving unit formed on the first support part to provide a driving force configured to move the tensile plate.

6. The deposition method of claim 1, wherein the tensile unit further comprises:
   a second driving unit connected to the pressing part to provide a driving force to the pressing part.

7. The deposition method of claim 6, further comprising a connection part configured to connect the elevation unit and the tensile unit,
   wherein the elevation unit comprises:
   a second support part configured to support the connection part; and
   a third driving unit formed on the second support part to provide a driving force configured to move the connection part, and
   wherein the pressing part and the second driving unit are formed on the connection part.

8. The deposition method of claim 1, further comprising an elevatable magnet part, wherein the magnet part is formed on a surface which is opposite to a surface of the tensile plate to which the electrostatic chuck is attached such that the magnet part presses the tensile plate.

9. The deposition method of claim 8, further comprising pressing the tensile plate by the magnet part from a surface which is opposite to a surface of the tensile plate to which the electrostatic chuck is attached, between the expanding of the tensile plate and the driving of the elevation unit to lower the tensile plate such that the substrate adheres to the mask.

* * * * *